United States Patent [19]

Hampel et al.

[11] Patent Number: 4,515,419

[45] Date of Patent: May 7, 1985

[54] ELECTRONIC INSTRUMENT WITH STAND DOUBLING AS CONSOLE COVER

[75] Inventors: Herbert J. Hampel, Feasterville, Pa.; Arthur G. Willers, Delran, N.J.

[73] Assignee: Northern Telecom Limited, Ontario, Canada

[21] Appl. No.: 390,970

[22] Filed: Jun. 22, 1982

[51] Int. Cl.³ .................... A47B 81/06; B65D 25/24
[52] U.S. Cl. .................... 312/7.1; 206/45.23; 220/94 R; 312/244
[58] Field of Search .............. 220/94 R; 312/244, 7.1; 222/475; 108/41; 206/45.2, 45.23; 248/359

[56] References Cited

U.S. PATENT DOCUMENTS

| | | | |
|---|---|---|---|
| 2,897,034 | 7/1959 | Kalen | 206/45.23 |
| 2,966,257 | 12/1960 | Littlejohn | 312/244 |
| 3,058,612 | 10/1962 | Nagy, Jr. | 206/45.2 |
| 3,711,175 | 1/1973 | Sottsass, Jr. | 312/244 |
| 4,032,204 | 6/1977 | Nation | 220/96 |
| 4,077,512 | 3/1978 | Heaton | 206/45.2 |
| 4,196,821 | 4/1980 | Teti, Jr. et al. | 220/94 R |

*Primary Examiner*—William E. Lyddane
*Assistant Examiner*—Thomas A. Rendos
*Attorney, Agent, or Firm*—Schwartz, Jeffery, Schwaab, Mack, Blumenthal & Koch

[57] ABSTRACT

A portable electronic instrument has a front console at which input/output functions are exposed. In order to protect the input/output functions when the instrument is being carried, a cover plate which is mounted to the instrument cabinet can be locked in a position covering the console. To use the instrument, the cover is unlocked and pivots to a position in which it doubles as a stand to space the front end of the instrument from an underlying support surface and to incline the console to the vertical.

2 Claims, 4 Drawing Figures

ELECTRONIC INSTRUMENT WITH STAND DOUBLING AS CONSOLE COVER

BACKGROUND OF THE INVENTION

This invention relates to electronic instruments in which an instrument stand doubles as a protective cover for a front console.

Electronic instruments such as oscilloscopes are usually characterized by a cabinet of parallelepiped configuration having a front console at which a number of input/output functions are exposed. These functions normally include a display, together with switches, dials, keys and knobs. Obviously, when the instrument is being carried, the most vulnerable part of the instruments is this front console. To this extent, the front console ideally should be covered when the instrument is being transported. This is done usually by inserting the instrument into a protective case or bag.

When the portable electronic instrument is set up, it is advantageously positioned with the front end of the cabinet spaced from a support surface so as to incline the front console to the vertical to make the input/output functions more accessible and easily viewable.

By the invention it is proposed that a stand for raising the cabinet front end doubles as an instrument console cover.

According to the invention there is provided an electronic instrument having a cabinet of generally parallelepiped configuration, the instrument having a front console having a plurality of input/output functions, a stand mounted to the cabinet, the stand movable between an operating position underlying a front end of the instrument in which position the stand supports and spaces the instrument from an underlying support surface, thereby to incline the console to a vertical plane, this stand movable to a carriage position in which the stand covers the console, the stand being lockable in said operating and carriage positions.

Preferably the stand has a generally rectangular flat base member which contacts the support surface in the operating position and which covers a generally rectangular front console in the carriage position. The base member can have a marginal flange projecting from an undersurface of the base member, the base member having a handle anchored thereto within the marginal flange, the flange projecting further from the undersurface than the handle in said operating position. The base member can have a marginal flange projecting also from its reverse surface, the second marginal flange dimensioned so as to snugly surround a forward edge of the cabinet in the carriage position.

Preferably brackets extend from opposite end edges of the rectangular base member, said brackets having passages through which extend fixture means cooperating with the cabinet. Preferably the passages are slots oriented perpendicular to the plane of the base member whereby with the fixture means released, the base member can be pulled from the carriage position preparatory to the stand being pivoted to the operating position. Each fixture means can be a screw clamp having a screw threaded portion, a relatively large diameter intermediate cylindrical portion, and a knurled plastic head, the screw threaded portion engaging in a threaded bore in the cabinet. Preferably the two brackets, at regions immediately adjacent the slots, are relatively thinner than outlying portions of the brackets except for a region of the brackets near the center of the slots. Together with the step-section screw clamps, this arrangement defines two locking positions. In one, the operating position, the screw clamp rests on one side of the relatively thick central region of the brackets to support the cabinet. In the other, the carriage position, the screw clamps locate on the reverse side of the relatively thick central region of the brackets so as to clamp the base member securely against the front console. The brackets preferably are integral with the taper inwardly from the base member.

BRIEF DESCRIPTION OF THE DRAWINGS

An embodiment of the invention will now be described by way of example with reference to the accompanying drawings in which.

DETAILED DESCRIPTION OF THE PREFERRED EMBODIMENT

Figure 1:
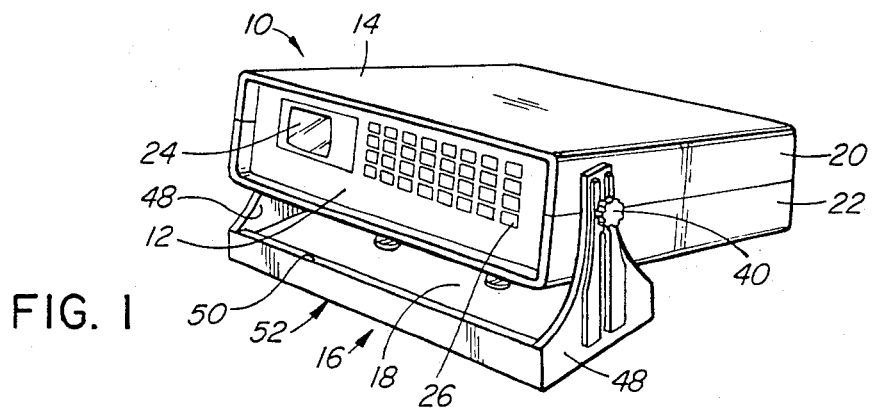
FIG. 1 is a perspective view of an electronic instrument according to the invention, the instrument being shown in an operating position.

Referring in detail to FIG. 1, an electronic instrument 10 such as an oscilloscope is characterized by a parallelepiped construction having a front console 12 including a number of input/output functions. The oscilloscope is shown in an operating position with a front end 14 of the instrument supported on a stand 16 so that the console is inclined to the vertical to make it both easily viewable and accessible to the oscilloscope user. The stand 16 doubles as protection for the console 12 when the instrument is being transported in the carriage position of FIG. 3.

As shown in FIG. 1, the instrument has a cabinet consisting of two U-section hermaphroditic moldings 20, 22. These two parts of the cabinet are held together by a rear panel (not shown) through which power supply and other leads are taken and by means of which a limited access to a circuit board housed within the cabinet is available. Attached to the two moldings is a front panel or console 12 on which are mounted the various input/output functions for the instruments. These functions are electrically connected to electrical circuits within the instrument. The oscilloscope illustrated has a small CRT display 24 at the left-hand side of the console 12. To the right are a number of keys 26 which are pressed to individually operate underlying switches (not shown). The console 12 is typical of many front consoles of, for example, oscilloscopes, voltmeters and datascopes. The various functions, particularly the CRT display 24, are of course susceptible to damage when the instrument is being transported.

Figure 3:
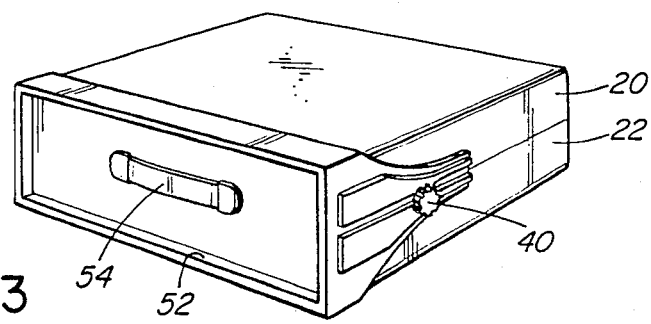
FIG. 3 shows the instrument of FIG. 1 but in a carriage position.
Figure 2:
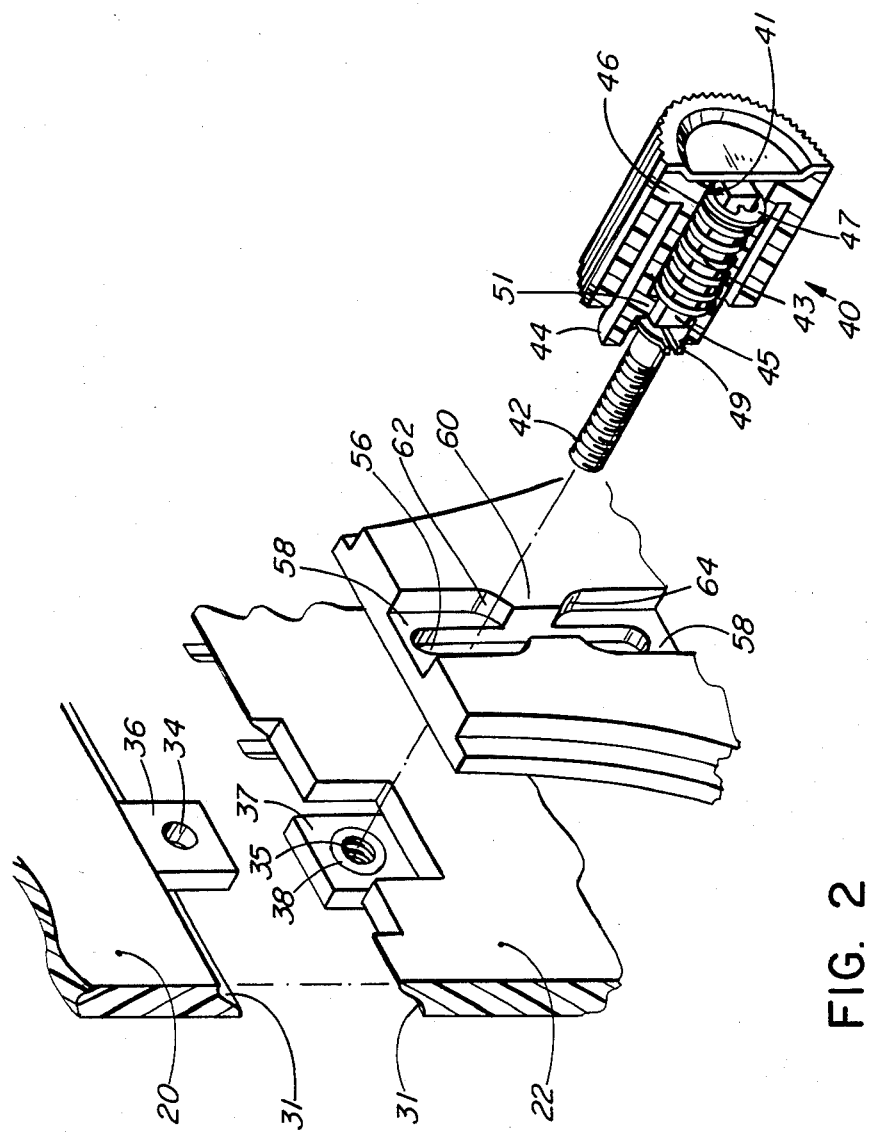
FIG. 2 shows an exploded detail of FIG. 1 to a larger scale.

As shown in the exploded view of FIG. 2, the U-section moldings 20, 22 have interlocking tongue and groove formations 31. When assembled, holes 34 and 35 through lugs 36 and 37, of moldings 20 and 22 respectively, are aligned. An internally threaded metal insert 38 fixed in each of the holes receives a spring clamp 40 having an inner threaded section 42, a wider cylindrical intermediate section 44, and a knurled plastic knob 46. The knurled knob 46 and the section 44 are integrally molded with one another. The section 44 has a chamber 41 housing a compression spring 43. The spring surrounds a square section spline 45 integral with threaded section 42. At one end, the spring 43 abuts a retaining ring 47 fixed into a groove extending around the spline 45. At the other end of the spring 43, the spring is spaced from a bottom retaining plate 49 by a part 51 of the section 44 which closely embraces the spline. The clamp 40 is screwed into the insert 38 in order to fix the moldings 20 and 22 together and to clamp the stand 16 to the cabinet. The stand consists of a rectangular base member 18 and two upstanding brackets 48. The base member 18 has at its edge a marginal flange 50 projecting above the upper surface of the base member and a marginal flange 52 projecting below the base member lower surface. Anchored to an underside of the base member 18, as shown in FIG. 3, is a carrying handle 54. The flange 52 projects further from the base member 18 than the handle 54 so that when the instrument is in its operating mode, the handle does not affect stability.

The brackets 48 have a central passage 56 through which the screw portions 42 of the clamps extend. The passages are slot-shaped in order that the stand can be clamped in a variety of positions. Each slot is flanked by a recess 58 except at a central portion 60. The intermediate cylindrical section 44 of the clamps locate within the recess 58 in a clamping condition. The central portion 60 serves to establish two primary clamping positions. As shown in FIG. 1, in the clamping position associated with normal instrument operation, the spring clamp 40 is located on one side of the region 60 and contacts curved surface 62 so as to support the cabinet. The other clamping position is shown in FIG. 3 with the cylindrical part 44 of the clamp locating against a curved surface 64 so as to clamp the base member 18 securely over the console. To move the stand between these two clamping positions, the clamps are pulled out against the action of springs 43 to a position where the cylindrical part 44 can pass over the raised part 60 of the brackets and then is let in on the other side of the raised part 60.

Figure 4:
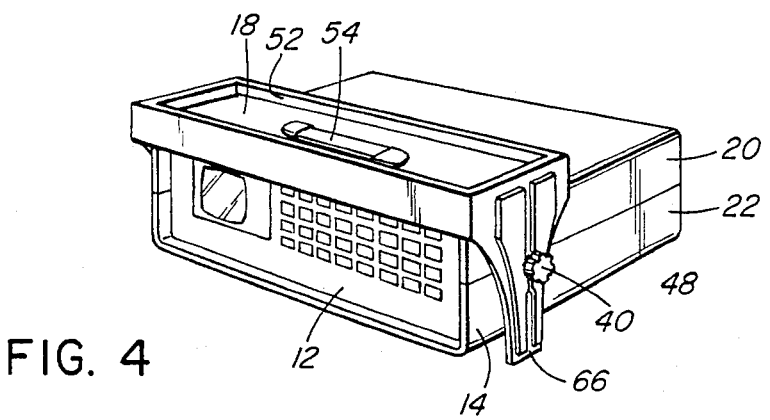
FIG. 4 shows the instrument of FIG. 1 in a stacking position.

Finally, a secondary position for the stand is shown in FIG. 4. In this position the spring clamps 40 and brackets 48 are in the FIG. 3 clamping position but the base member 18 is locked on top of the front end 14 of the instrument. A thinner part 66 of the brackets projects below the base of the instrument. This particular configuration is useful if the instrument is to be positioned on top of another piece of equipment which has a top surface sloping downwardly towards the rear. Parts 66 of the brackets prevent the instrument from sliding backwards off the underlying equipment.

What is claimed is:

1. An electronic instrument having a cabinet, a front console with a plurality of input/output elements visible thereat, a flat cover/stand having a handle attached at one side and first and second arms integral with the cover/stand and extending from the other side thereof, a shaft axis extending through said cabinet and an elongated slot formed in a respective arm, said shaft axis passing through each said slot to permit pivotal and translational movement between said cabinet and said cover/stand about said shaft axis, wherein a part of the arm defining each said slot has a first region laterally adjacent a central part of the slot and second regions laterally adjacent flanking parts of the slot, the arm having a surface relief such that the first region is higher than the second regions thereby to form abutment surfaces, a shaft at each side of the cabinet aligned on said shaft axis and a knob mounted on each shaft, each knob having a shank portion, and means for movably biasing each knob along said shaft axis to produce a positive abutment between the shank portion of said each knob and the abutment surface of a respective slot such that said respective slot can be moved along said respective shank portion to position opposite sides of said respective central part to lock the cabinet, respectively, in a carriage position or an operating position such that, in the carriage position, the cover/stand is held against the console with a positive abutment existing between the knob shank portions and respective abutment surfaces on one side of said central parts to prevent movement of the cover/stand away from the cabinet when the instrument is lifted by the handle, and, in the operating position, the cover/stand is held away from the console and positioned to rest against an instrument supporting surface and to support the cabinet in an inclined position with a positive abutment existing between the knob shank portions and respective abutment surfaces on the opposite sides of said central parts to prevent movement of the cabinet towards the cover/stand.

2. An electronic instrument having a cabinet, a front console with a plurality of input/output elements visible thereat, a flat cover/stand having a handle attached on one side and first and second arms integral with the cover/stand and extending from the other side thereof, and means for securing the first and second arms, respectively, to opposed sides of the cabinet, permitting pivotal and translational movement of the cover/stand relative to the cabinet, and locking the cabinet in a carriage position or an operating position such that, in the carriage position, the cover/stand is held against the console with a positive abutment existing between the means and respective arms to prevent movement of the cover/stand away from the cabinet when the instrument is lifted by the handle, and, in the operating position, the cover/stand is held away from the console and positioned to rest against an instrument supporting surface and to support the cabinet in an inclined position with a positive abutment existing between the means and respective arms to prevent movement of the cabinet towards the cover/stand, said means comprising: screws received in respective internally threaded bores within side walls of the cabinet, a longitudinally extending slot formed in each of said arms through which a respective one of said screws extends, each of said screws having a knob, a first shank portion extending from the knob, and a second smaller diameter portion extending from the first shank portion, and in which, a part of the arm defining each slot has a first region laterally adjacent a central part of the slot and second regions laterally adjacent flanking parts of the slot, the arm having surface relief such that the first region is higher than the second regions thereby to form abutment surfaces for positive abutment between the first screw shank portion and the arm.

* * * * *